(12) United States Patent
Tagami

(10) Patent No.: US 11,887,903 B2
(45) Date of Patent: Jan. 30, 2024

(54) POWER SEMICONDUCTOR DEVICE, METHOD FOR MANUFACTURING POWER SEMICONDUCTOR DEVICE, AND POWER CONVERSION APPARATUS

(71) Applicant: Mitsubishi Electric Corporation, Tokyo (JP)

(72) Inventor: Tomonori Tagami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 157 days.

(21) Appl. No.: 17/683,002

(22) Filed: Feb. 28, 2022

(65) Prior Publication Data

US 2022/0336301 A1 Oct. 20, 2022

(30) Foreign Application Priority Data

Apr. 19, 2021 (JP) ................. 2021-070532

(51) Int. Cl.
| | | |
|---|---|---|
| H01L 23/26 | (2006.01) | |
| H01L 21/48 | (2006.01) | |
| H01L 23/053 | (2006.01) | |
| H01L 23/367 | (2006.01) | |
| H01L 23/14 | (2006.01) | |
| H01L 23/498 | (2006.01) | |
| H01L 23/31 | (2006.01) | |

(52) U.S. Cl.
CPC ............ *H01L 23/053* (2013.01); *H01L 23/14* (2013.01); *H01L 23/3114* (2013.01); *H01L 23/367* (2013.01); *H01L 23/49838* (2013.01)

(58) Field of Classification Search
CPC ............. H01L 23/49838; H01L 23/367; H01L 23/3114; H01L 23/14; H01L 23/053
See application file for complete search history.

(56) References Cited

U.S. PATENT DOCUMENTS

| | | | |
|---|---|---|---|
| 6,201,696 B1 * | 3/2001 | Shimizu | ................ H01L 24/49 361/708 |
| 2005/0224945 A1 * | 10/2005 | Saito | ................ H01L 23/49575 257/E23.052 |
| 2019/0088577 A1 * | 3/2019 | Shimoyama | ............ H01L 24/48 |
| 2020/0098671 A1 * | 3/2020 | Zhou | .................... H01L 25/072 |

FOREIGN PATENT DOCUMENTS

JP 2019-125678 A 7/2019

* cited by examiner

*Primary Examiner* — Hoa B Trinh
(74) *Attorney, Agent, or Firm* — Studebaker & Brackett PC

(57) ABSTRACT

A semiconductor element is bonded to a circuit pattern integrated with an insulating layer and a heat radiation fin, a case is bonded to a peripheral edge of the heat radiation fin so as to surround the semiconductor element, the circuit pattern, and the insulating layer, and a sealing resin is sealed in a region surrounded by the insulating layer, the circuit pattern, and the case. An internal electrode includes a flat plate-shaped portion, and is provided with a through hole and a pair of bent and inclined-shaped support portions. The support portion is bonded to the circuit pattern, and the upper surface of the semiconductor element, the through hole, and an embossed portion provided around the through hole are bonded. The internal electrode, and an external electrode integrally molded with the case, are bonded.

11 Claims, 10 Drawing Sheets

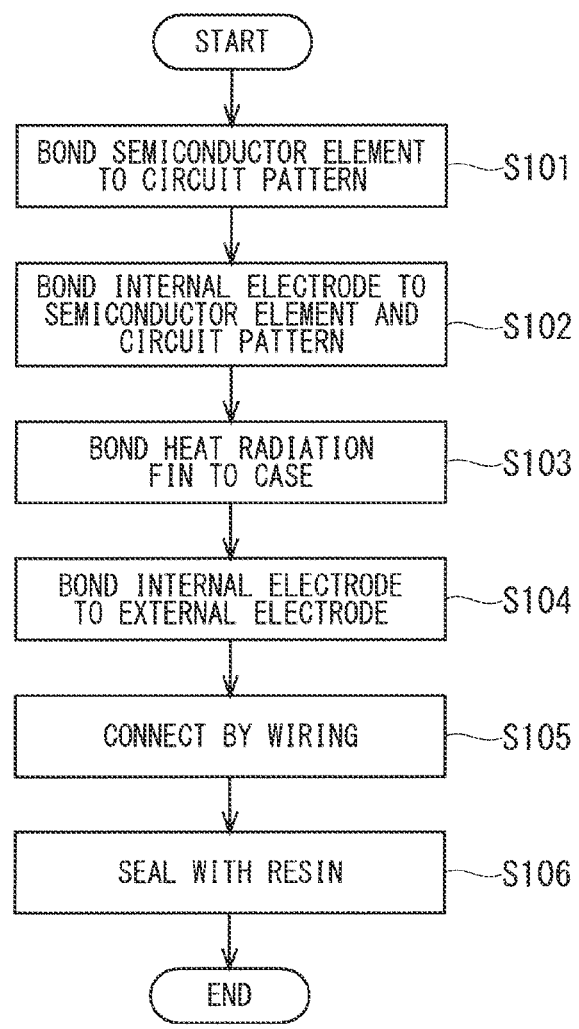
F I G. 4

POWER SEMICONDUCTOR DEVICE, METHOD FOR MANUFACTURING POWER SEMICONDUCTOR DEVICE, AND POWER CONVERSION APPARATUS

BACKGROUND OF THE INVENTION

Field of the Invention

The present disclosure relates to a power semiconductor device, a method for manufacturing a power semiconductor device, and a power conversion apparatus.

Description of the Background Art

In a conventional power semiconductor device, a semiconductor chip is mounted on a circuit pattern of an insulating substrate provided on an aluminum fin, the insulating substrate and the semiconductor chip are surrounded by a case, and the inside of the case is sealed with a sealing resin. The first lead frame integrated with the case is bonded onto the semiconductor chip with interposition of solder, and the first spacer formed of the insulating resin is sandwiched between the circuit pattern of the insulating substrate and the first lead frame and is provided with interposition of an adhesive. (See, for example, Japanese Patent Application Laid-Open No. 2019-125678 (paragraphs 0013 to 0022, FIG. 1))

However, in order to bond the first spacer to the circuit pattern and the first lead frame, a new adhesive preparation and bonding step are required. In addition, when the semiconductor chip and the first lead frame are bonded with interposition of solder, it is necessary to heat the solder, the semiconductor chip, and the first lead frame to raise the temperature by reflow or the like in order to melt the solder. In particular, due to the structure, since it is difficult to raise the temperature of the first lead frame to a desired temperature, and furthermore, the first spacer is a resin having insulating properties and the thermal conductivity is low, the temperature rise is insufficient, and in some cases, it has been difficult to obtain a favorable solder bonding portion with the solder thickness secured.

SUMMARY

The present disclosure has been made in order to solve the above-mentioned problems, and has an object to provide a power semiconductor device including a high-quality and highly reliable bonding portion with the bonding thickness secured.

In addition, the present disclosure has an object to provide a method for manufacturing a power semiconductor device including a high-quality and highly reliable bonding portion with the bonding thickness secured, which is aimed at improving productivity by a simple manufacturing method.

The power semiconductor device according to the present disclosure is a power semiconductor device including: a semiconductor element; a circuit pattern mounted with the semiconductor element; an insulating layer mounted with the circuit pattern; a heat radiation fin mounted with the insulating layer; a case bonded to a peripheral edge of the heat radiation fin and surrounding the semiconductor element, the circuit pattern, and the insulating layer; a sealing resin sealed in a region surrounded by the insulating layer, the circuit pattern, and the case; an internal electrode bonded to the semiconductor element and the circuit pattern, including a flat plate-shaped portion, and including a pair of support portions; and an external electrode bonded to the internal electrode and integrally molded with the case.

In addition, the method for manufacturing a power semiconductor device according to the present disclosure is a method for manufacturing a power semiconductor device, the method including the steps of: bonding a semiconductor element to a circuit pattern mounted on a heat radiation fin with interposition of an insulating layer; bonding the semiconductor element to an internal electrode, and bonding the internal electrode to the circuit pattern; bonding the heat radiation fin to a case; bonding the internal electrode to an external electrode integrally molded with the case; wire-bonding and connecting by wiring the semiconductor element to a control terminal integrally molded with the case with a metal wire; and sealing with resin a region surrounded by the insulating layer, the circuit pattern, and the case.

According to the power semiconductor device according to the present disclosure, a high-quality and highly reliable bonding portion with the bonding thickness secured can be obtained.

According to the method for manufacturing a power semiconductor device according to the present disclosure, a high-quality and highly reliable bonding portion with the bonding thickness secured can be obtained by a simple manufacturing method for improving productivity.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 4 is a flowchart showing a method for manufacturing the power semiconductor device according to the first preferred embodiment;

DESCRIPTION OF THE PREFERRED EMBODIMENTS

First Preferred Embodiment

Figure 1:
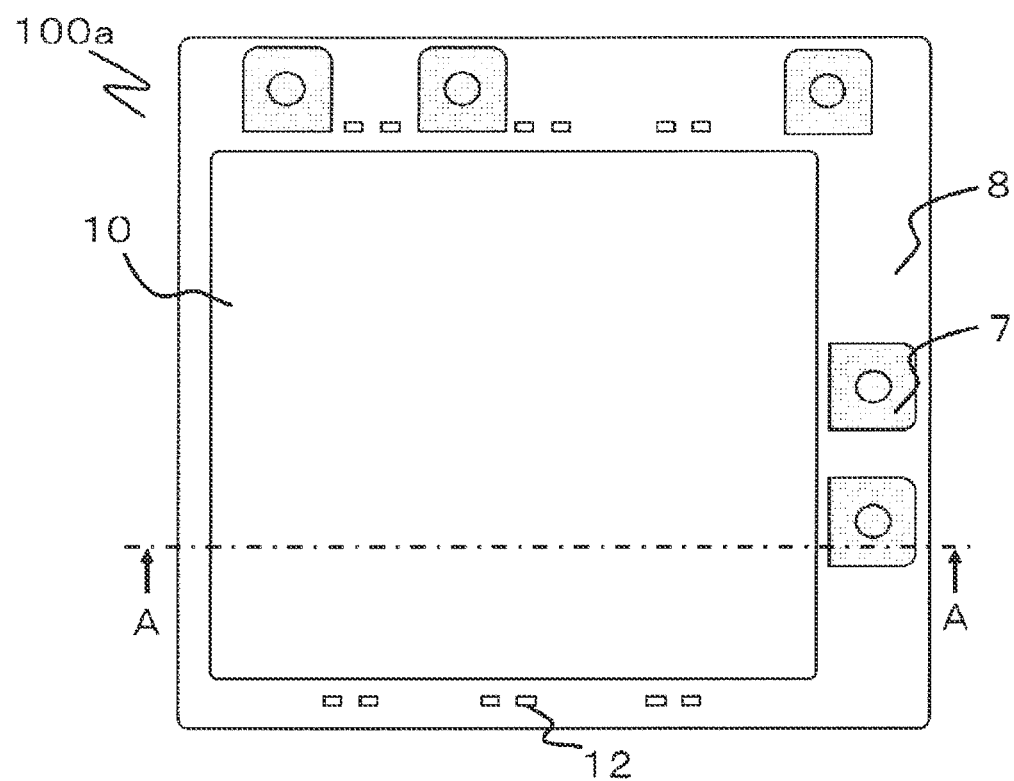
FIG. 1 is a plan view illustrating an appearance of a power semiconductor device according to a first preferred embodiment.
Figure 2:
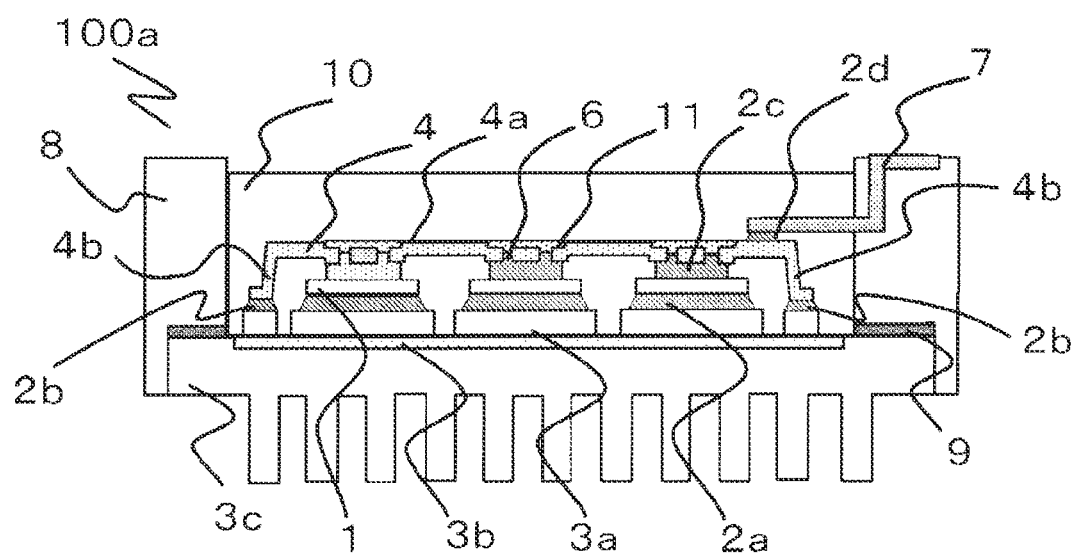
FIG. 2 is a cross-sectional view illustrating a configuration of the power semiconductor device according to the first preferred embodiment.
Figure 3:
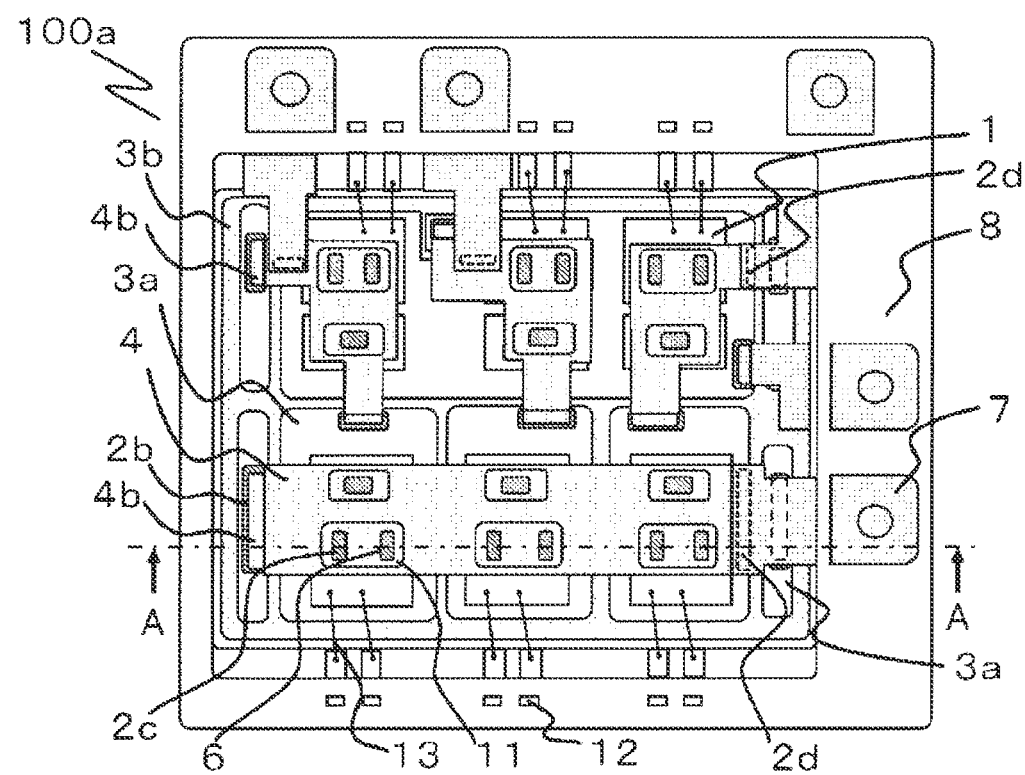
FIG. 3 is a plan view illustrating a configuration of the power semiconductor device according to the first preferred embodiment before sealing with the sealing resin.

A configuration of a power semiconductor device 100a according to a first preferred embodiment will be described with reference to the drawings. FIG. 1 is a plan view illustrating an appearance of the power semiconductor device 100a. FIG. 2 is a cross-sectional view taken along the line A-A in FIG. 1. FIG. 3 is a plan view illustrating the configuration of the power semiconductor device 100a before sealing with the sealing resin 10. It should be noted that the position corresponding to the line A-A in FIG. 1 is also shown in FIG. 3.

As shown in FIG. 1, regarding the appearance of the upper surface of the power semiconductor device 100a in a plan view, the peripheral edge of the power semiconductor device 100a is surrounded by the case 8, the inside of the case 8 is covered with the sealing resin 10, and the external electrode 7 and the control terminal 12 integrally molded with the case 8 are extended and exposed to the outside so that they can be connected to the outside, in order to be electrically input from and output to the outside.

As shown in FIG. 2, the power semiconductor device 100a includes a semiconductor element 1, a heat radiation fin 3c, an internal electrode 4, an external electrode 7, a case 8, and a sealing resin 10.

The heat radiation fin 3c and the case 8 are bonded together and fixed with an adhesive 9 at the peripheral edge portion of the heat radiation fin 3c. In addition, the lower surface of the semiconductor element 1 is bonded to the circuit pattern 3a arranged in parallel with the semiconductor element 1 and provided on the heat radiation fin 3c with interposition of the bonding material 2a. The upper surface of the semiconductor element 1 is bonded to the internal electrode 4 arranged in parallel with the semiconductor element 1 with interposition of the bonding material 2c. The internal electrode 4 and the external electrode 7 are bonded to each other with interposition of a bonding material 2d. Here, the lower surface of the semiconductor element 1 indicates a surface on the circuit pattern 3a side provided on the heat radiation fin 3c, and the upper surface of the semiconductor element 1 indicates a surface on the internal electrode 4 side of the semiconductor element 1.

As shown in FIG. 2, the heat radiation fin 3c is provided with an insulating layer 3b, a circuit pattern 3a is provided on the surface opposite to the heat radiation fin 3c of the insulating layer 3b, and the heat radiation fin 3c, the insulating layer 3b, and the circuit pattern 3a are arranged and integrated in parallel, and have a function as a cooler for radiating heat from the heat-generating semiconductor element 1.

The heat radiation fin 3c is a metal containing any one of Cu and Al and being excellent in thermal conductivity, and the thickness including the protruding fins is 8 to 15 mm. The insulating layer 3b has a thickness of 0.1 to 0.8 mm and contains any one of aluminum nitride (AlN) and silicon nitride ($Si_3N_4$). The circuit pattern 3a is a conductive material containing any one of Cu and Al and has a thickness of 0.2 to 1.5 mm.

In addition, the insulating layer 3b may be an epoxy resin containing a filler containing any one of BN or $Al_2O_3$. The thermal conductivity is 6 to 18 W/(m·K), which can meet the heat radiation specifications required for the power semiconductor device 100a.

The semiconductor element 1 is what is called a power semiconductor element that controls electric power. For example, Si or a wide bandgap semiconductor having a larger bandgap than Si is included as a material. The wide bandgap semiconductor is, for example, SiC, GaN, diamond, or the like. The semiconductor element 1 is, for example, an insulated gate bipolar transistor (IGBT), a metal oxide semiconductor field effect transistor (MOSFET), a Schottky barrier diode, or the like. In addition, for example, the semiconductor element 1 may be a reverse conducting IGBT (RC-IGBT) in which an IGBT and a reflux diode are integrated in one semiconductor chip.

As shown in FIGS. 2 and 3, at least one semiconductor element 1 is mounted. A required number of semiconductor elements 1 can be mounted according to the specifications of the power semiconductor device 100a.

In addition, the bonding material 2a for bonding the semiconductor element 1 to the circuit pattern 3a is a conductive metal containing Sn and is what is called solder. It should be noted that since the semiconductor element 1 generates heat, the bonding material 2a is not limited to solder, and may be a sintered material using fine metal particles containing Ag or Cu having a higher thermal conductivity than solder and having heat radiation.

It should be noted that when the bonding material 2a is particularly solder, in order to secure wettability with the solder, Ni plating may be applied to at least a part of the surface to be bonded to the bonding material 2a in the circuit pattern 3a.

The case 8 contains any one of a poly phenylene sulfide (PPS) resin and a poly butylene terephthalate (PBT) resin.

As shown in FIGS. 2 and 3, the external electrode 7 is made of Cu or a material containing Cu, is insert-molded and integrated together with the case 8, and a part of the external electrode 7 is embedded in the case 8. As shown in FIG. 2, the external electrode 7 is bent, and one tip portion of the external electrode 7 is exposed from the case 8 in order to be electrically input from and output to the outside. The other tip portion of the external electrode 7 is arranged in parallel with the flat plate-shaped portion 4a of the internal electrode 4 toward the inside of the case 8 in a plan view, and is projected and exposed in a flat surface shape.

As shown in FIGS. 2 and 3, the internal electrode 4 is made of Cu or a material containing Cu, and includes a flat plate-shaped portion 4a arranged to be in parallel with the semiconductor element 1. The thickness of the internal electrode 4 is a uniform thickness of 0.5 to 1.2 mm so that a large current can flow. The internal electrode 4 is arranged parallel to the semiconductor element 1, the circuit pattern 3a, and the external electrode 7, and is bonded to the upper surface of the semiconductor element 1, the circuit pattern 3a, and the external electrode 7.

In addition, the internal electrode 4 is formed with a through hole 6 in the thickness direction of the flat plate-shaped portion 4a of the internal electrode 4. An embossed portion 11 provided with a step of about 0.5 mm in a protruding shape toward the semiconductor element 1 side is formed around the through hole 6 by a press or the like.

An electrode is provided on the upper surface of the semiconductor element 1 (not shown), and the upper surface of the semiconductor element 1, the through hole 6 of the internal electrode 4, and the embossed portion 11 provided around the through hole 6 are bonded to each other with interposition of the bonding material 2c. When the bonding material 2c is particularly solder, the embossed portion 11 sufficiently wets and spreads the solder to the internal electrode 4, so that the solder wettability can be secured. The bonding thickness of the bonding material 2c is 0.2 to 1.0 mm.

In addition, as shown in FIGS. 2 and 3, in the internal electrode 4, a pair of bent and inclined-shaped support portions 4b is formed toward the circuit pattern 3a at one tip portion and the other tip portion, and one tip portion and the other tip portion of the internal electrode 4 are bonded to the circuit pattern 3a with interposition of the bonding material 2b.

Thus, the internal electrode 4 can be stably supported and fixed to the circuit pattern 3a by the pair of support portions 4b provided on one tip portion and the other tip portion of the internal electrode 4. Therefore, the thickness of the bonding material 2c between the upper surface of the semiconductor element 1 and the internal electrode 4 can be secured. As shown in FIGS. 2 and 3, the same internal electrodes 4 bonded to the upper surfaces of a plurality of semiconductor elements 1 easily secure the bonding thickness of the bonding material 2c on the upper surfaces of the respective semiconductor elements 1 and obtain favorable bonding. In addition, the thermal stress and thermal strain of the bonding material 2c occurring in the environment in which the power semiconductor device 100a is used can be suppressed. Therefore, it is possible to obtain high-quality bonding and improve the reliability of the bonding material 2c.

It should be noted that the bonding material 2c may be filled in the through hole 6 from the upper surface of the semiconductor element 1 to be bonded also to and covered with the upper surface of the embossed portion 11, and have, for example, a protruding shape to bulge in a dome shape. The upper side of the embossed portion 11 is a surface opposite to the semiconductor element 1 of the embossed portion 11. Thus, the thermal stress and thermal strain occurring in the bonding material 2c can be further relaxed.

In addition, in the internal electrode 4, a pair of bent and inclined-shaped support portions 4b is formed at one tip portion and the other tip portion. Since one tip portion and the other tip portion of the internal electrode 4 are bonded to the circuit pattern 3a with interposition of the bonding material 2b, with respect to the heat-generating semiconductor element 1, heat can be efficiently radiated, in a well-balanced manner as a whole without concentrating heat, from the upper surface of the semiconductor element 1 to the circuit pattern 3a, the insulating layer 3b, and the heat radiation fin 3c through the internal electrode 4, in addition to the heat radiation to the lower surface of the semiconductor element 1. It should be noted that the circuit pattern 3a includes a circuit pattern 3a in which the semiconductor element 1 is not mounted. Thus, it is possible to improve the heat radiation of the semiconductor element 1 that generates heat.

Furthermore, even with respect to heat generated by a large current flowing through the internal electrode 4, similarly, heat can be efficiently radiated, in a well-balanced manner as a whole without concentrating heat, from the internal electrode 4 to the insulating layer 3b and the heat radiation fin 3c through the circuit pattern 3a. It should be noted that the circuit pattern 3a includes a circuit pattern 3a in which the semiconductor element 1 is not mounted. Thus, it is possible to improve the heat radiation of the internal electrode 4 that generates heat. Therefore, since the semiconductor element 1 is prevented from reaching a high temperature, stable operation can be performed.

As shown in FIGS. 2 and 3, the internal electrode 4 is bonded to the external electrode 7 with interposition of the bonding material 2d. Thus, unlike Japanese Patent Application Laid-Open No. 2019-125678 (paragraphs 0013 to 0022, FIG. 1), since the internal electrode 4 is not integrated with the case 8 by insert molding, it is possible to secure the bonding thickness of the bonding material 2c on the upper surface of the semiconductor element 1 and to relax the thermal stress and the thermal strain on the bonding material 2c. In addition, the heat generated by the semiconductor element 1 and the internal electrode 4 can be radiated to the outside connected to the external electrode 7.

It should be noted that the bonding material 2b, the bonding material 2c, and the bonding material 2d are conductive metals containing Sn, and are what is called solder. It should be noted that since the semiconductor element 1 generates heat, the bonding material 2b, the bonding material 2c, and the bonding material 2d are not limited to solder, and may be a sintered material using fine metal particles containing Ag or Cu having a higher thermal conductivity than solder and having heat radiation.

It should be noted that when the bonding material 2b, the bonding material 2c, and the bonding material 2d are particularly solder, in order to secure wettability with the solder, Ni plating may be applied to at least some of the surfaces to be bonded to the bonding material 2b, the bonding material 2c, and the bonding material 2d in the circuit pattern 3a, the internal electrode 4, and the external electrode 7.

As shown in FIG. 3, the control terminal 12 is made of Cu or a material containing Cu, is insert-molded and integrated together with the case 8, and a part of the control terminal 12 is embedded in the case 8. One tip portion of the control terminal 12 is exposed and extends from the case 8 in order to be electrically input from and output to the outside. As shown in FIG. 3, the other tip portion of the control terminal 12 is exposed from the case 8 and is electrically connected to the semiconductor element 1 with the metal wire 13. The metal wire 13 is a material containing any one of Al and Cu. The diameter of the metal wire 13 is 0.1 to 0.5 mm.

As shown in FIG. 2, in the region surrounded by the case 8, on the surfaces of the insulating layer 3b and the circuit pattern 3a on the side where the semiconductor element 1 is mounted, the sealing resin 10 is filled and sealed around the semiconductor element 1, the internal electrode 4, and the external electrode 7 inside the case 8. The sealing resin 10 is an epoxy resin having thermosetting property and containing a filler containing $SiO_2$, but is not limited to this, and has only to be a resin having the required elastic modulus, thermal conductivity, heat resistance, insulating property, and adhesiveness. For example, in addition to the epoxy resin, a silicone resin, a phenol resin, a polyimide resin, or the like may be used.

Since the heat radiation fin 3c and the case 8 are bonded and fixed with the adhesive 9, the sealing resin 10 can be prevented from leaking to the outside when the sealing resin 10 is filled in the region surrounded by the case 8, and insulation can be secured inside the power semiconductor device 100a. The adhesive 9 is a silicone resin. Alternatively, the adhesive 9 may be the same material as the sealing resin 10.

In this way, the internal electrode 4 is provided with the through hole 6 and the pair of bent and inclined-shaped support portions 4b, and the support portion 4b of the internal electrode 4 is bonded to the circuit pattern 3a integrated with the heat radiation fin 3c and the insulating layer 3b with interposition of the bonding material 2b, whereby the internal electrode 4 can be stably supported and fixed to the circuit pattern 3a. Thus, the same internal electrodes 4 bonded to the upper surfaces of a plurality of semiconductor elements 1 easily secure the bonding thickness of the bonding material 2c on the upper surfaces of the respective semiconductor elements 1 and obtain favorable bonding. In addition, the thermal stress and thermal strain of the bonding material 2c occurring in the environment in which the power semiconductor device 100a is used can be suppressed. Therefore, it is possible to obtain high-quality bonding and improve the reliability of the bonding material 2c.

In addition, with respect to the heat-generating semiconductor element 1, a heat radiation path can be expanded and heat can be efficiently radiated, in a well-balanced manner as a whole without concentrating heat, from the upper surface of the semiconductor element 1 to the circuit pattern 3a, the insulating layer 3b, and the heat radiation fin 3c through the internal electrode 4, in addition to the heat radiation to the lower surface of the semiconductor element 1. It should be noted that the circuit pattern 3a includes a circuit pattern 3a in which the semiconductor element 1 is not mounted. Thus, it is possible to improve the heat radiation of the semiconductor element 1 that generates heat.

Furthermore, even with respect to heat generated by a large current flowing through the internal electrode 4, similarly, the heat radiation path can be expanded and heat can be efficiently radiated, in a well-balanced manner as a whole without concentrating heat, from the internal electrode 4 to the insulating layer 3b and the heat radiation fin 3c through the circuit pattern 3a. It should be noted that the circuit pattern 3a includes a circuit pattern 3a in which the semiconductor element 1 is not mounted. Thus, it is possible to improve the heat radiation of the internal electrode 4 that generates heat. Therefore, since the semiconductor element 1 is prevented from reaching a high temperature, stable operation can be performed.

Next, a method for manufacturing the power semiconductor device 100a will be described.

FIG. 4 is a flowchart showing a method for manufacturing the power semiconductor device 100a in the first preferred embodiment. Here, an example of bonding with solder, that is, an example in which the bonding material 2a, the bonding material 2b, the bonding material 2c, and the bonding material 2d are solder is shown. Steps S101 to S106, which are the steps, will be described in detail.

In step S101, the lower surface of the semiconductor element 1 is bonded to the circuit pattern 3a with the bonding material 2a. The bonding material 2a is a paste-like solder or a plate-shaped solder. At this time, the bonding is heated by heat conduction from the heat radiation fin 3c and hot air in the reflow, and the bonding is completed through subsequent cooling. The heating temperature is 230 to 300° C. to correspond to the melting point of the solder containing Sn. It should be noted that although not shown, a dedicated jig is used to fix the mounting position of the semiconductor element 1 with respect to the circuit pattern 3a.

In step S102, the internal electrode 4 including the through hole 6 and the embossed portion 11 is bonded to the upper surface of the semiconductor element 1 with the bonding material 2c, and the support portion 4b of the internal electrode 4 is bonded to the circuit pattern 3a with the bonding material 2b. The bonding material 2b and the bonding material 2c are a paste-like solder or a plate-shaped solder. The bonding material 2b and the bonding material 2c have the same material as the bonding material 2a, or are solder containing Sn and having a composition having a melting point lower than that of the bonding material 2a. As in step S101, the bonding is heated by heat conduction from the heat radiation fin 3c and hot air in the reflow, and the bonding is completed through subsequent cooling. It should be noted that although not shown, a dedicated jig is used to fix the mounting position of the internal electrode 4.

Since the bonding is heated by heat conduction from the heat radiation fin 3c and hot air in the reflow, heat is transferred not only through the semiconductor element 1 but also through the bonding material 2b, and the temperature of the internal electrode 4 and the bonding material 2c can be raised to a desired temperature. Thus, the bonding thickness of the bonding material 2c can be easily secured on the upper surface of the semiconductor element 1, and favorable bonding can be obtained.

In step S103, the adhesive 9 is applied to the peripheral edge of the heat radiation fin 3c, and the case 8 is bonded to the heat radiation fin 3c. An adhesive 9 containing silicone or an adhesive 9 made of the same material as the sealing resin 10 is applied. After application, heating the adhesive surface cures the adhesive 9, and the heat radiation fin 3c and the case 8 can be bonded with interposition of the adhesive 9. Thus, in the step of injecting and filling a sealing resin 10 described below and sealing with resin, the sealing resin 10 does not leak to the outside.

In step S104, the external electrode 7 is bonded to the internal electrode 4 with the bonding material 2d. As in step S101, the bonding is heated by heat conduction from the heat radiation fin 3c and hot air in the reflow, and the bonding is completed through subsequent cooling. Heat is transferred not only through the semiconductor element 1 but also through the bonding material 2b, and the temperature of the internal electrode 4, the external electrode 7, and the bonding material 2d can be raised to a desired temperature, and a favorable bonding can be obtained. It should be noted that the step of curing the adhesive 9 to bond in step S103 may be collectively and simultaneously performed in the step of heating for bonding the external electrode 7 to the internal electrode 4 with the bonding material 2d. Thus, the external electrode 7 can be bonded to the internal electrode 4 with the bonding material 2d, and the heat radiation fin 3c and the case 8 can be bonded. Therefore, the number of heating steps can be reduced and the productivity can be improved.

In step S105, the semiconductor element 1 and the control terminal 12 are wire-bonded and connected by wiring with a metal wire 13 formed of a material containing any one of Al and Cu. By applying ultrasonic vibration to the metal wire 13 while pressurizing by an ultrasonic tool (not shown), the metal wire 13 is ultrasonically bonded to the semiconductor element 1 and the control terminal 12 and connected by wiring.

In step S106, the sealing resin 10 is injected and filled, for sealing with resin, on the upper side of the insulating layer 3b and circuit pattern 3a surrounded by the case 8, so as to fill the semiconductor element 1, the internal electrode 4, and the external electrode 7 inside the case 8, with the sealing resin 10. After sealing with resin, the sealing resin 10 is cured by heating. Thus, since the bonding material 2a, the bonding material 2b, the bonding material 2c, the bonding material 2d, and the bonding place of the metal wire 13 are fixed by covering the periphery with a sealing resin, the insulating property is secured, and the reliability can be improved.

In this way, the internal electrode 4 is provided with the through hole 6 and the pair of bent and inclined-shaped support portions 4b, and the support portion 4b of the internal electrode 4 is bonded to the circuit pattern 3a integrated with the heat radiation fin 3c and the insulating layer 3b with interposition of the bonding material 2b, whereby the internal electrode 4 can be stably supported and fixed to the circuit pattern 3a. Thus, the same internal electrodes 4 bonded to the upper surfaces of a plurality of semiconductor elements 1 can easily secure the bonding thickness of the bonding material 2c on the upper surfaces of the respective semiconductor elements 1 and can obtain favorable bonding. In addition, the thermal stress and thermal strain of the bonding material 2c occurring in the environment in which the power semiconductor device 100a is used can be suppressed. Therefore, it is possible to obtain high-quality bonding and improve the reliability of the bonding material 2c.

In addition, with respect to the heat-generating semiconductor element 1, a heat radiation path can be expanded and heat can be efficiently radiated, in a well-balanced manner as a whole without concentrating heat, from the upper surface of the semiconductor element 1 to the circuit pattern 3a, the insulating layer 3b, and the heat radiation fin 3c through the internal electrode 4, in addition to the heat radiation to the lower surface of the semiconductor element 1. It should be noted that the circuit pattern 3a includes a circuit pattern 3a in which the semiconductor element 1 is not mounted. Thus, it is possible to improve the heat radiation of the semiconductor element 1 that generates heat.

Furthermore, even with respect to heat generated by a large current flowing through the internal electrode 4, similarly, the heat radiation path can be expanded and heat can be efficiently radiated, in a well-balanced manner as a whole without concentrating heat, from the internal electrode 4 to the insulating layer 3b and the heat radiation fin 3c through the circuit pattern 3a. It should be noted that the circuit pattern 3a includes a circuit pattern 3a in which the semiconductor element 1 is not mounted. Thus, it is possible to improve the heat radiation of the internal electrode 4 that generates heat. Therefore, since the semiconductor element 1 is prevented from reaching a high temperature, stable operation can be performed.

Figure 5:
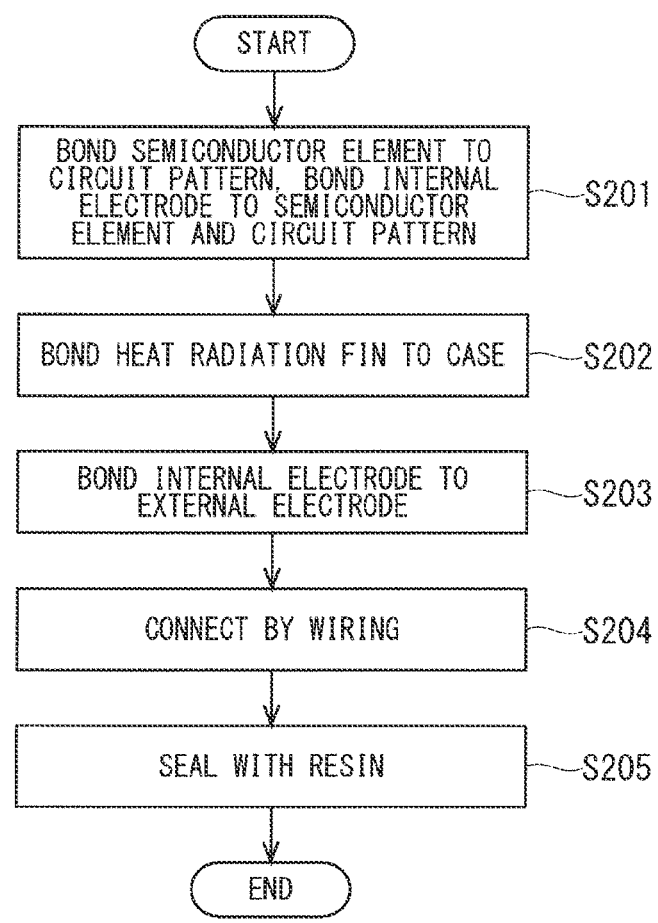
FIG. 5 is a flowchart showing a modified example of the method for manufacturing the power semiconductor device according to the first preferred embodiment.

A flowchart is shown in FIG. 5 as a modified example of the method for manufacturing the power semiconductor device 100a in the first preferred embodiment. As in FIG. 4, here, an example of bonding with solder, that is, an example in which the bonding material 2a, the bonding material 2b, the bonding material 2c, and the bonding material 2d are solder is shown. Steps S201 to S205, which are the steps, will be described in detail.

In step S201, a bonding step of bonding the lower surface of the semiconductor element 1 to the circuit pattern 3a with the bonding material 2a, a bonding step of bonding the internal electrode 4 having a through hole 6 and an embossed portion 11 to the upper surface of the semiconductor element 1 with the bonding material 2c, and a bonding step of bonding the support portion 4b of the internal electrode 4 to the circuit pattern 3a with the bonding material 2b are collectively and simultaneously performed for bonding. At this time, the bonding is heated by heat conduction from the heat radiation fin 3c and hot air in the reflow, and the bonding is completed through subsequent cooling. It should be noted that although not shown, a dedicated jig is used to fix the mounting position of the semiconductor element 1 and the internal electrode 4. Therefore, the number of heating steps can be reduced and the productivity can be improved.

In step S202, the adhesive 9 is applied to the peripheral edge of the heat radiation fin 3c, and the case 8 is bonded to the heat radiation fin 3c. An adhesive 9 containing silicone or an adhesive 9 made of the same material as the sealing resin 10 is applied. After application, heating the adhesive surface cures the adhesive 9, and the heat radiation fin 3c and the case 8 can be bonded with interposition of the adhesive 9. Thus, in the step of injecting and filling a sealing resin 10 described below and sealing with resin, the sealing resin 10 does not leak to the outside.

In step S203, the external electrode 7 is bonded to the internal electrode 4 with the bonding material 2d. As in step S201, the bonding is heated by heat conduction from the heat radiation fin 3c and hot air in the reflow, and the bonding is completed through subsequent cooling. It should be noted that the step of curing the adhesive 9 to bond in step S202 may be collectively and simultaneously performed in the step of heating for bonding the external electrode 7 to the internal electrode 4 with the bonding material 2d. Thus, the external electrode 7 can be bonded to the internal electrode 4 with the bonding material 2d, and the heat radiation fin 3c and the case 8 can be bonded. Therefore, the number of heating steps can be reduced and the productivity can be improved.

In step S204, the semiconductor element 1 and the control terminal 12 are wire-bonded and connected by wiring with a metal wire 13 formed of a material containing any one of Al and Cu. By applying ultrasonic vibration to the metal wire 13 while pressurizing by an ultrasonic tool (not shown), the metal wire 13 is ultrasonically bonded to the semiconductor element 1 and the control terminal 12 and connected by wiring.

In step S205, the sealing resin 10 is injected and filled, for sealing with resin, on the upper side of the semiconductor element 1, the insulating layer 3b, and circuit pattern 3a surrounded by the case 8, so as to fill the semiconductor element 1, the internal electrode 4, and the external electrode 7 inside the case 8, with the sealing resin 10. After sealing with resin, the sealing resin 10 is cured by heating. Thus, since the bonding material 2a, the bonding material 2b, the bonding material 2c, the bonding material 2d, and the bonding place of the metal wire 13 are fixed by covering the periphery with a sealing resin, the insulating property is secured, and the reliability can be improved.

Thus, the number of times of input to the reflow can be reduced and the heating time can be reduced, and along with improving productivity, the influence of warpage of each component such as the heat radiation fin 3c, the insulating layer 3b, the circuit pattern 3a, the semiconductor element 1, the internal electrode 4, and the external electrode 7 integrated with the case 8 can be reduced to a minimum.

It should be noted that in the flowcharts shown in FIGS. 4 and 5, an example in which the bonding material 2a, the bonding material 2b, the bonding material 2c, and the bonding material 2d are solder is shown, but they are not limited to solder, and may be a sintered material using fine metal particles containing Ag or Cu having a higher thermal conductivity than solder and having heat radiation.

In the first preferred embodiment, the semiconductor element 1 is bonded to the circuit pattern 3a integrated with the insulating layer 3b and the heat radiation fin 3c, the case 8 is bonded to the peripheral edge of the heat radiation fin 3c so as to surround the semiconductor element 1, the circuit pattern 3a, and the insulating layer 3b, and the sealing resin 10 is sealed in the region surrounded by the insulating layer 3b, the circuit pattern 3a, and the case 8 so as to cover the periphery of the semiconductor element 1, the internal electrode 4, and the external electrode 7 inside the case 8. An external electrode 7 bonded to the internal electrode 4 with interposition of a bonding material 2d and integrally molded with the case 8 is provided.

The internal electrode 4 includes a flat plate-shaped portion 4a, is provided with a through hole 6 and a pair of bent and inclined-shaped support portions 4b, and the support portion 4b of the internal electrode 4 is bonded with interposition of the bonding material 2b, whereby the internal electrode 4 can be stably supported and fixed to the circuit pattern 3a. Thus, the same internal electrodes 4 bonded to the upper surfaces of a plurality of semiconductor elements 1 easily secure the bonding thickness of the bonding material 2c on the upper surfaces of the respective semiconductor elements 1 and obtain favorable bonding. In addition, the thermal stress and thermal strain of the bonding material 2c occurring in the environment in which the power semiconductor device 100a is used can be suppressed. With the above configuration, it is possible to secure the bonding thickness, obtain a high-quality bonding, and improve the reliability of the bonding material 2c.

In addition, with respect to the heat-generating semiconductor element 1, a heat radiation path can be expanded and heat can be efficiently radiated, in a well-balanced manner as a whole without concentrating heat, from the upper surface of the semiconductor element 1 to the circuit pattern 3a, the insulating layer 3b, and the heat radiation fin 3c through the internal electrode 4, in addition to the heat radiation to the lower surface of the semiconductor element 1. It should be noted that the circuit pattern 3a includes a circuit pattern 3a in which the semiconductor element 1 is not mounted. Thus, it is possible to improve the heat radiation of the semiconductor element 1 that generates heat.

Furthermore, even with respect to heat generated by a large current flowing through the internal electrode 4, similarly, the heat radiation path can be expanded and heat can be efficiently radiated, in a well-balanced manner as a whole without concentrating heat, from the internal electrode 4 to the insulating layer 3b and the heat radiation fin 3c through the circuit pattern 3a. It should be noted that the circuit pattern 3a includes a circuit pattern 3a in which the semiconductor element 1 is not mounted. Thus, it is possible to improve the heat radiation of the internal electrode 4 that generates heat. Therefore, since the semiconductor element 1 is prevented from reaching a high temperature, stable operation can be performed.

In the internal electrode 4, a pair of bent and inclined-shaped support portions 4b are formed in one tip portion and the other tip portion, and are bonded to the circuit pattern 3a with interposition of the bonding material 2b, but the support portions 4b are not limited to a pair, and three or more support portions 4b may be provided for the same internal electrode 4. Thus, the internal electrode 4 can be more stably supported and fixed to the circuit pattern 3a.

It should be noted that the cooler is not limited to an integration of the heat radiation fin 3c, the insulation layer 3b and the circuit pattern 3a, and may include separate members of the heat radiation fin 3c and an insulating layer 3b on whose upper surface and lower surface in the thickness direction of the insulating layer 3b respective circuit patterns 3a are provided. In this case, the circuit pattern 3a provided on the insulating layer 3b is bonded to the heat radiation fin 3c.

The internal electrode 4 and the external electrode 7 are separate members. In order to bond the internal electrode 4 to the external electrode 7, which are composed of different members, with interposition of the bonding material 2d, even when each of the components such as the heat radiation fin 3c, the insulating layer 3b, the circuit pattern 3a, the semiconductor element 1, the internal electrode 4, the case 8, and the external electrode 7 is warped due to repeated heating by inputting into the reflow multiple times, the thermal stress and thermal strain occurring in the bonding material 2c on the upper surface of the semiconductor element 1 can be relaxed.

Second Preferred Embodiment

Figure 6:
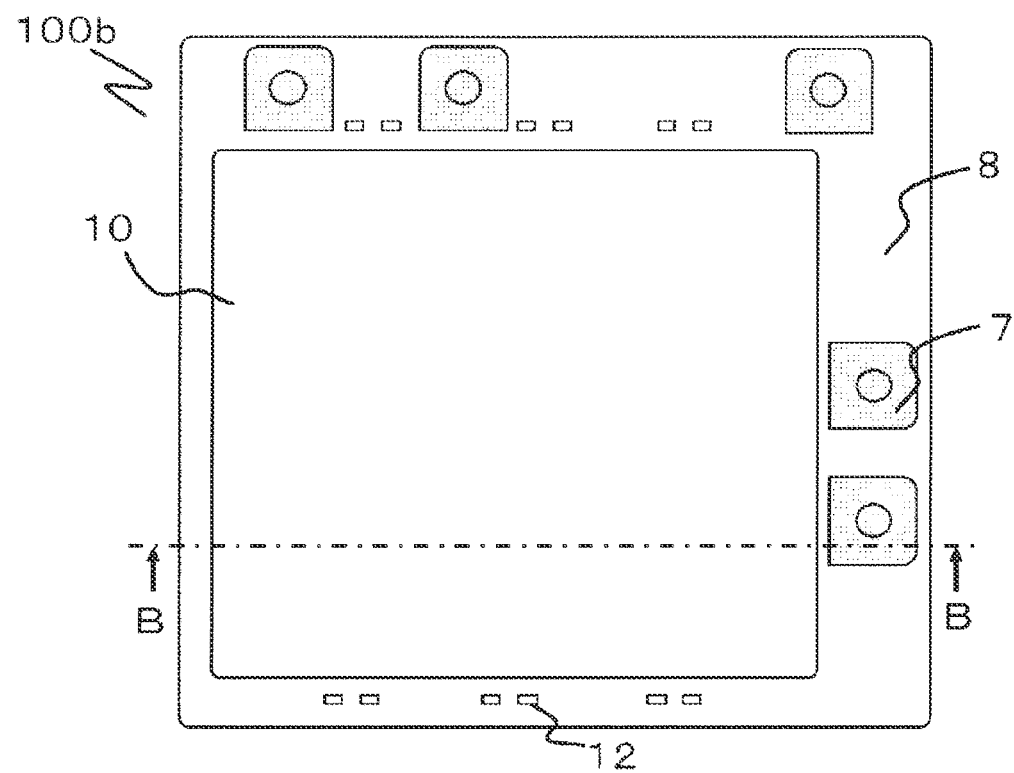
FIG. 6 is a plan view illustrating an appearance of a power semiconductor device according to a second preferred embodiment.
Figure 7:
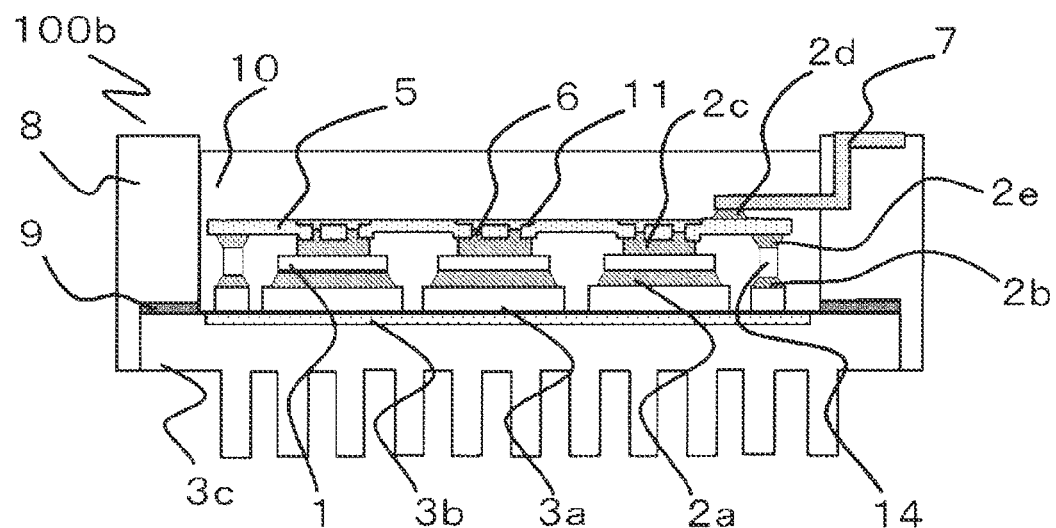
FIG. 7 is a cross-sectional view illustrating a configuration of the power semiconductor device according to the second preferred embodiment.
Figure 8:
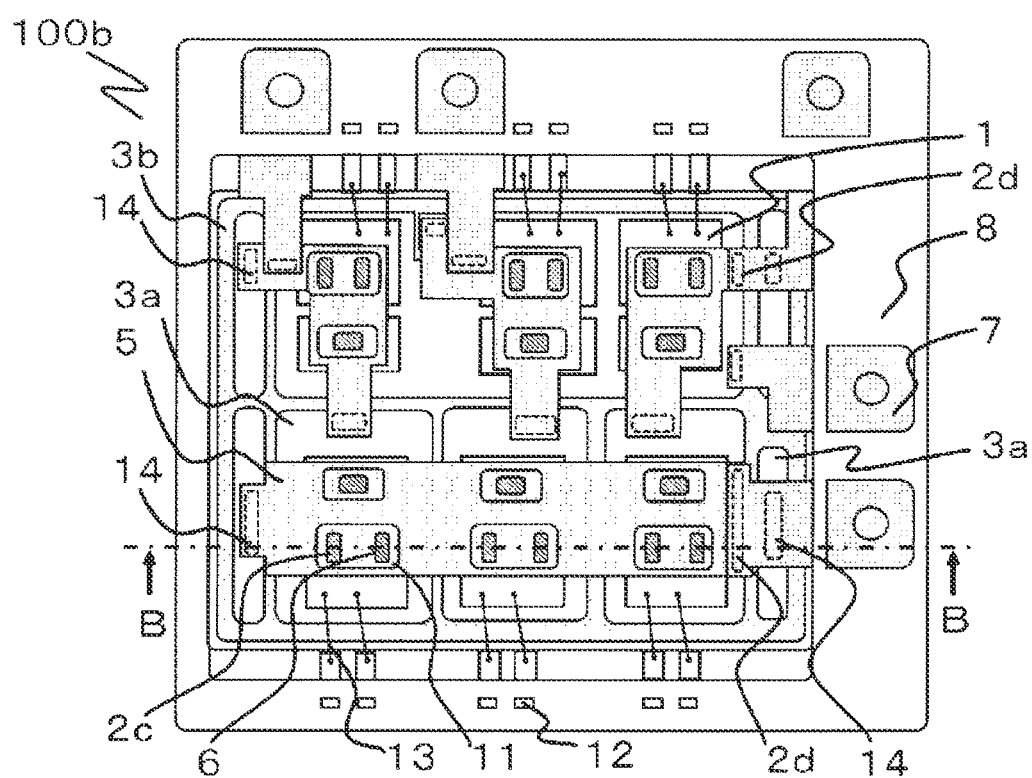
FIG. 8 is a plan view illustrating a configuration of the power semiconductor device according to the second preferred embodiment before sealing with the sealing resin.

FIG. 6 is a plan view illustrating an appearance of the power semiconductor device 100b according to the second preferred embodiment. FIG. 7 is a cross-sectional view taken along the line B-B in FIG. 6. FIG. 8 is a plan view illustrating the configuration of the power semiconductor device 100b before sealing with the sealing resin 10. It should be noted that the position corresponding to the line B-B in FIG. 6 is also shown in FIG. 8. It should be noted that the power semiconductor device 100b in the present preferred embodiment has many configurations in common with those in the first preferred embodiment. Therefore, the points different from those of the first preferred embodiment will be described, and the same or corresponding configurations will be denoted by the same reference numerals, and the description thereof will be omitted. The configuration is different from that of the first preferred embodiment in that as shown in FIGS. 7 and 8, instead of the support portion 4b, the entire internal electrode 5 has a flat plate shape, a support member 14 made of a metal having high thermal conductivity is provided, and in order that the semiconductor element 1 and the internal electrode 5 are arranged in parallel, one end portion of the support member 14 is bonded to the circuit pattern 3a with interposition of the bonding material 2b and the other end portion of the support member 14 is bonded to the internal electrode 5 with interposition of the bonding material 2e.

The internal electrode 5 has a flat plate shape and is made of Cu or a material containing Cu. The thickness of the internal electrode 5 is a uniform thickness of 0.5 to 1.2 mm so that a large current can flow. The internal electrode 5 is arranged parallel to the semiconductor element 1, the circuit pattern 3a, and the external electrode 7, and is bonded to the upper surface of the semiconductor element 1, the support member 14, and the external electrode 7.

In addition, the internal electrode 5 is formed with a through hole 6 in the thickness direction of the internal electrode 5. An embossed portion 11 provided with a step of about 0.5 mm in a protruding shape toward the semiconductor element 1 side is formed around the through hole 6 by a press or the like.

An electrode is provided on the upper surface of the semiconductor element 1 (not shown), and the upper surface of the semiconductor element 1, the through hole 6 of the internal electrode 5, and the embossed portion 11 provided around the through hole 6 are bonded to each other with interposition of the bonding material 2c. When the bonding material 2c is particularly solder, the embossed portion 11 sufficiently wets and spreads the solder to the internal electrode 5, so that the solder wettability can be secured. The bonding thickness of the bonding material 2c is 0.2 to 1.0 mm.

The support member 14 is a metal having a high thermal conductivity. The support member 14 is, for example, a metallic material containing any one of Cu and Al. As shown in FIGS. 7 and 8, regarding the support member 14, a pair of support members 14 is provided at one tip portion and the other tip portion of the internal electrode 5. A pair of support members 14 bonded to the circuit pattern 3a with interposition of the bonding material 2b is bonded respectively to one tip portion and the other tip portion of the internal electrode 5 with interposition of the bonding material 2e.

In addition, the support member 14 has a rectangular parallelepiped shape with the maximum size possible according to the circuit pattern 3a of the internal electrode 5 and the size of the internal electrode 5. It should be noted that the support member 14 is not limited to a rectangular parallelepiped, and may have a shape including a curved portion such as an S shape with respect to the direction between the internal electrode 5 and the circuit pattern 3a, or a shape in which the width of both end portions and the width of the central portion of the support member 14 are different. Thus, the internal electrode 5 can be stably supported and fixed to the circuit pattern 3a, the heat capacity can be increased, and heat radiation can be improved.

In addition, the bonding material 2b bonding the support member 14 to the circuit pattern 3a and the bonding material 2e bonding the support member 14 to the internal electrode 5 are conductive metals containing Sn, and are what is called solders. It should be noted that since the internal electrode 5 generates heat due to the large current flowing therethrough, the bonding material 2a is not limited to solder, and may be a sintered material using fine metal particles containing Ag or Cu having a higher thermal conductivity than solder and having heat radiation.

When the bonding material 2b and the bonding material 2e are particularly solder, in order to secure wettability with the solder, Ni plating may be applied to at least some of the surfaces to be bonded to the bonding material 2b and the bonding material 2e in the circuit pattern 3a and the internal electrode 5.

Next, a method for manufacturing the power semiconductor device 100b will be described.

Figure 9:
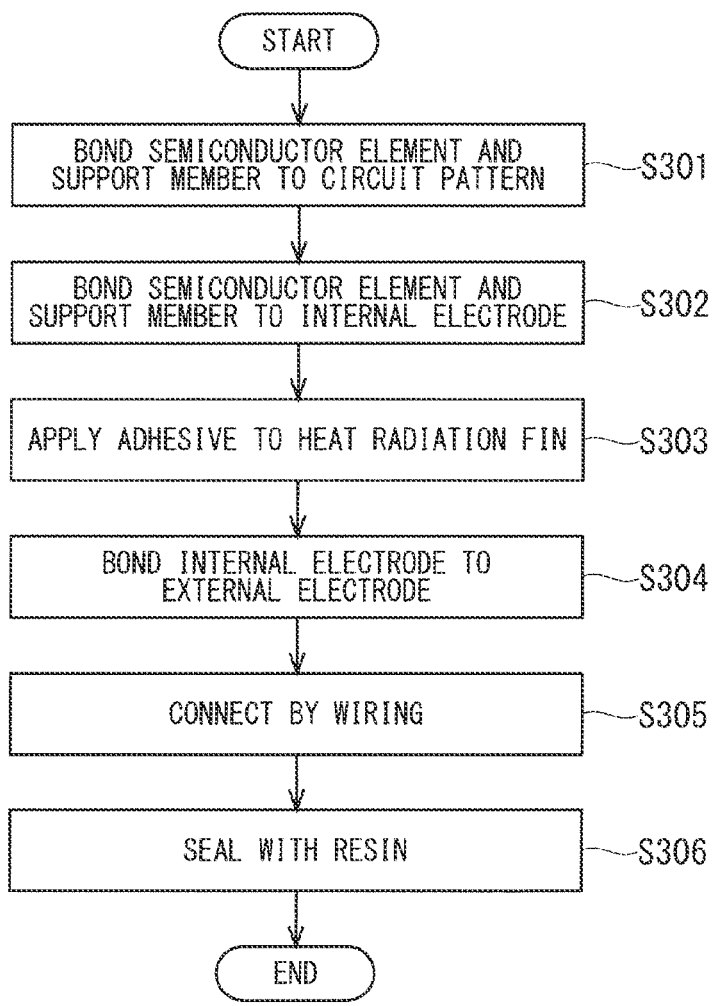
FIG. 9 is a flowchart showing a method for manufacturing the power semiconductor device according to the second preferred embodiment.

FIG. 9 is a flowchart showing a method for manufacturing the power semiconductor device 100b in the second preferred embodiment. Here, an example of bonding with solder, that is, an example in which the bonding material 2a, the bonding material 2b, the bonding material 2c, the bonding material 2d, and the bonding material 2e are solder is shown. Steps S301 to S305, which are the steps, will be described in detail.

In step S301, the lower surface of the semiconductor element 1 is bonded to the circuit pattern 3a with the bonding material 2a, and one end portion of the support member 14 is bonded to the circuit pattern 3a with the bonding material 2b. The bonding material 2a and the bonding material 2b are a paste-like solder or a plate-shaped solder. At this time, the bonding is heated by heat conduction from the heat radiation fin 3c and hot air in the reflow, and the bonding is completed through subsequent cooling. The heating temperature is 230 to 300° C. to correspond to the melting point of the solder containing Sn. It should be noted that although not shown, a dedicated jig is used to fix the mounting position of the semiconductor element 1 and the support member 14 with respect to the circuit pattern 3a.

In step S302, the internal electrode 5 including the through hole 6 and the embossed portion 11 is bonded to the upper surface of the semiconductor element 1 with the bonding material 2c, and the other end portion of the support member 14 is bonded to the internal electrode 5 with the bonding material 2e. The bonding material 2c and the bonding material 2e are a paste-like solder or a plate-shaped solder. The bonding material 2c and the bonding material 2e have the same material as the bonding material 2a, or are solder containing Sn and having a composition having a melting point lower than that of the bonding material 2a. As in step S301, the bonding is heated by heat conduction from the heat radiation fin 3c and hot air in the reflow, and the bonding is completed through subsequent cooling. It should be noted that although not shown, a dedicated jig is used to fix the mounting position of the internal electrode 5.

Since the bonding is heated by heat conduction from the heat radiation fin 3c and hot air in the reflow, heat is transferred not only through the semiconductor element 1 but also through the bonding material 2b, and the temperature of the internal electrode 5 and the bonding material 2c can be raised to a desired temperature. Thus, the bonding thickness of the bonding material 2c can be easily secured on the upper surface of the semiconductor element 1, and favorable bonding can be obtained.

In step S303, the adhesive 9 is applied to the peripheral edge of the heat radiation fin 3c, and the case 8 is bonded to the heat radiation fin 3c. An adhesive 9 containing silicone or an adhesive 9 made of the same material as the sealing resin 10 is applied. After application, heating the adhesive surface cures the adhesive 9, and the heat radiation fin 3c and the case 8 can be bonded with interposition of the adhesive 9. Thus, in the step of injecting and filling a sealing resin 10 described below and sealing with resin, the sealing resin 10 does not leak to the outside.

In step S304, the external electrode 7 is bonded to the internal electrode 5 with the bonding material 2d. As in step S301, the bonding is heated by heat conduction from the heat radiation fin 3c and hot air in the reflow, and the bonding is completed through subsequent cooling. Heat is transferred not only through the semiconductor element 1 but also through the bonding material 2b, and the temperature of the internal electrode 5, the external electrode 7, and the bonding material 2d can be raised to a desired temperature, and a favorable bonding can be obtained. It should be noted that the step of curing the adhesive 9 to bond in step S303 may be collectively and simultaneously performed in the step of heating for bonding the external electrode 7 to the internal electrode 5 with the bonding material 2d. Thus, the external electrode 7 can be bonded to the internal electrode 5 with the bonding material 2d, and the heat radiation fin 3c and the case 8 can be bonded. Therefore, the number of heating steps can be reduced and the productivity can be improved.

In step S305, the semiconductor element 1 and the control terminal 12 are wire-bonded and connected by wiring with a metal wire 13 formed of a material containing any one of Al and Cu. By applying ultrasonic vibration to the metal wire 13 while pressurizing by an ultrasonic tool (not shown), the metal wire 13 is ultrasonically bonded to the semiconductor element 1 and the control terminal 12 and connected by wiring.

In step S306, the sealing resin 10 is injected and filled, for sealing with resin, on the upper side of the insulating layer 3b and circuit pattern 3a surrounded by the case 8, so as to fill the semiconductor element 1, the internal electrode 5, and the external electrode 7 inside the case 8, with the sealing resin 10. After sealing with resin, the sealing resin 10 is cured by heating. Thus, since the bonding material 2a, the bonding material 2b, the bonding material 2c, the bonding material 2d, the bonding material 2e, and the bonding place of the metal wire 13 are fixed by covering the periphery with a sealing resin, the insulating property is secured, and the reliability can be improved.

In the second preferred embodiment, the semiconductor element 1 is bonded to the circuit pattern 3a integrated with the insulating layer 3b and the heat radiation fin 3c, the case 8 is bonded to the peripheral edge of the heat radiation fin 3c so as to surround the semiconductor element 1, the circuit pattern 3a, and the insulating layer 3b, and the sealing resin 10 is sealed in the region surrounded by the insulating layer 3b, the circuit pattern 3a, and the case 8 so as to cover the periphery of the semiconductor element 1, the internal electrode 5, and the external electrode 7 inside the case 8. An external electrode 7 bonded to the internal electrode 5 with interposition of a bonding material 2d and integrally molded with the case 8 is provided.

The internal electrode 5 has a flat plate shape and is provided with a through hole 6. One end portion of the support member 14 is bonded to the circuit pattern 3a with interposition of the bonding material 2b, and the other end portion of the support member 14 is bonded to the internal electrode 5 with interposition of the bonding material 2e, whereby the internal electrode 5 is stably supported and fixed to the circuit pattern 3a. Thus, the same internal electrodes 5 bonded to the upper surfaces of a plurality of semiconductor elements 1 easily secure the bonding thickness of the bonding material 2c on the upper surfaces of the respective semiconductor elements 1 and obtain favorable bonding. In addition, the thermal stress and thermal strain of the bonding material 2c occurring in the environment in which the power semiconductor device 100b is used can be suppressed. With the above configuration, it is possible to secure the bonding thickness, obtain a high-quality bonding, and improve the reliability of the bonding material 2c.

In addition, with respect to the heat-generating semiconductor element 1, a heat radiation path can be expanded and heat can be efficiently radiated, in a well-balanced manner as a whole without concentrating heat, from the upper surface of the semiconductor element 1 to the circuit pattern 3a, the insulating layer 3b, and the heat radiation fin 3c through the internal electrode 5 and the support member 14, in addition to the heat radiation to the lower surface of the semiconductor element 1. It should be noted that the circuit pattern 3a includes a circuit pattern 3a in which the semiconductor element 1 is not mounted. Thus, it is possible to improve the heat radiation of the semiconductor element 1 that generates heat.

Furthermore, even with respect to heat generated by a large current flowing through the internal electrode 5, similarly, the heat radiation path can be expanded and heat can be efficiently radiated, in a well-balanced manner as a whole without concentrating heat, from the internal electrode 5 to the insulating layer 3b and the heat radiation fin 3c through the support member 14 and the circuit pattern 3a. It should be noted that the circuit pattern 3a includes a circuit pattern 3a in which the semiconductor element 1 is not mounted. Thus, it is possible to improve the heat radiation of the internal electrode 5 that generates heat. Therefore, since the semiconductor element 1 is prevented from reaching a high temperature, stable operation can be performed.

It should be noted that as shown in FIGS. 7 and 8, a pair of support members 14 are bonded to one tip portion and the other tip portion of the internal electrode 5 with interposition of the bonding material 2e, but the support members 14 are not limited to a pair, and three or more support members 14 may be bonded to the same internal electrode 5 and bonded to the circuit pattern 3a. Thus, the internal electrode 5 can be more stably supported and fixed to the circuit pattern 3a.

It should be noted that the support member 14 has only to have a thermal conductivity that allows the bonding material 2c, the internal electrode 5, and the external electrode 7 to rise in temperature to a desired temperature by reflow, and may have a material having a reduced elastic modulus or have a spring property.

In addition, the reflow may be performed in a reducing atmosphere in order to prevent oxidation of the circuit pattern 3a, the internal electrode 5, and the external electrode 7 by heating.

Third Preferred Embodiment

In the present preferred embodiment, the power semiconductor device 100a or 100b according to the above-described first to second preferred embodiments is applied to a power conversion apparatus. Although the present preferred embodiment is not limited to a specific power conversion apparatus, in the following, a case where the present invention is applied to a three-phase inverter will be described as a third preferred embodiment.

Figure 10:
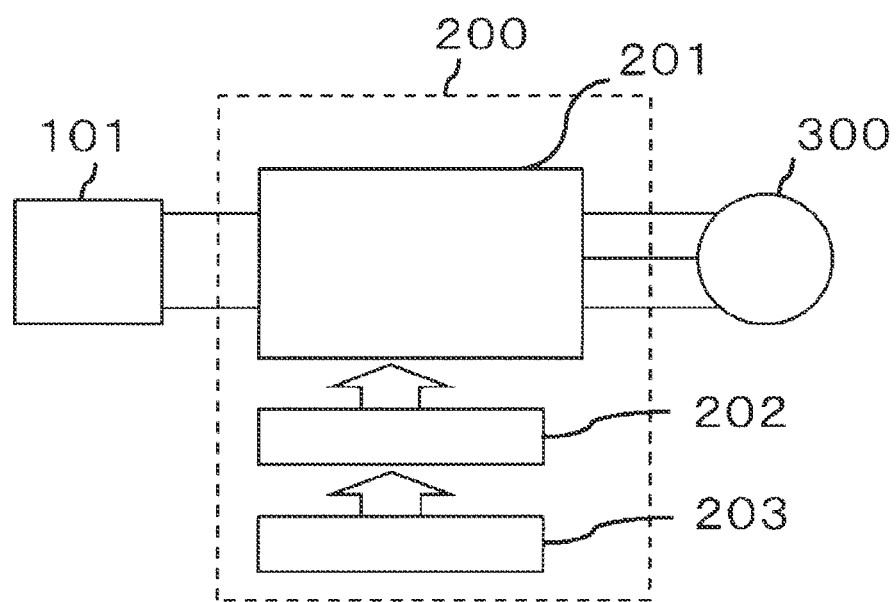
FIG. 10 is a block diagram illustrating a configuration of a power conversion system including a power conversion apparatus according to a third preferred embodiment.

FIG. 10 is a block diagram illustrating a configuration of a power conversion system to which the power conversion apparatus 200 according to the present preferred embodiment is applied.

The power conversion system shown in FIG. 10 includes a power supply 101, a power conversion apparatus 200, and a load 300. The power supply 101 is a DC power supply, and supplies DC power to the power conversion apparatus 200. The power supply 101 can include various components, can include, for example, a DC system, a solar cell, and a storage battery, and may include a rectifier circuit or an AC/DC converter connected to an AC system. In addition, the power supply 101 may include a DC/DC converter for converting DC power output from the DC system into predetermined power.

The power conversion apparatus 200 is a three-phase inverter connected between the power supply 101 and the load 300, converts DC power supplied and input from the power supply 101 into AC power, and supplies AC power to the load 300. As shown in FIG. 10, the power conversion apparatus 200 includes a main conversion circuit 201 for converting DC power into AC power to output the converted power, a drive circuit 202 for outputting a drive signal for driving each switching element of the main conversion circuit 201, and a control circuit 203 for outputting a control signal for controlling the drive circuit 202 to the drive circuit 202.

The load 300 is a three-phase electric motor driven by AC power supplied from the power conversion apparatus 200. It should be noted that the load 300 is not limited to a specific application, and is a motor mounted on various electric apparatuses, and is used as, for example, a hybrid vehicle, an electric vehicle, a railway vehicle, an elevator, or a motor for an air conditioner.

Hereinafter, details of the power conversion apparatus 200 will be described. The main conversion circuit 201 includes a switching element and a freewheeling diode (not shown), and switching of the switching element converts the DC power supplied from the power supply 101 into AC power to supply the AC power to the load 300. There are various specific circuit configurations of the main conversion circuit 201, and the main conversion circuit 201 according to the present preferred embodiment is a two-level three-phase full bridge circuit and can include six switching elements and six freewheeling diodes antiparallel to the respective switching elements. The power semiconductor device according to any one of the above-described first to second preferred embodiments is applied to each switching element of the main conversion circuit 201. It should be noted that, here, a case where the power semiconductor device 100a according to the first preferred embodiment is used will be described. Six switching elements are connected in series for every two switching elements to constitute upper and lower arms, and the respective upper and lower arms constitute each phase (U phase, V phase, and W phase) of the full bridge circuit. Then, the output terminals of the respective upper and lower arms, that is, the three output terminals of the main conversion circuit 201 are connected to the load 300.

The drive circuit 202 generates drive signals for driving the switching elements of the main conversion circuit 201, and supplies the drive signals to the control electrodes of the switching elements of the main conversion circuit 201.

Specifically, in accordance with a control signal from a control circuit 203 to be described below, a drive signal to turn on the switching element and a drive signal to turn off the switching element are output to the control electrodes of the respective switching elements. When the switching element is maintained in the ON state, the drive signal is a voltage signal not less than the threshold voltage of the switching element (ON signal), and when the switching element is maintained in the OFF state, the drive signal is a voltage signal not more than the threshold voltage of the switching element (OFF signal).

The control circuit 203 controls the switching elements of the main conversion circuit 201 so that desired power is supplied to the load 300. Specifically, based on the power to be supplied to the load 300, the time required for each switching element of the main conversion circuit 201 to be turned on (ON time) is calculated. For example, the main conversion circuit 201 can be controlled by PWM control for modulating the ON time of the switching element according to the voltage to be output. Then, a control instruction (control signal) is output to the drive circuit 202 so that, at each time point, the ON signal is output to the switching element to be turned on and the OFF signal is output to the switching element to be turned off. The drive circuit 202 outputs the ON signal or OFF signal as a drive signal to the control electrode of each switching element in accordance with the control signal.

In the power conversion apparatus 200 according to the present preferred embodiment, since the power semiconductor device according to the first preferred embodiment is applied as a switching element of the main conversion circuit 201, reliability can be improved.

Although the two-level power conversion apparatus 200 has been described in the present preferred embodiment, the present preferred embodiment is not limited to this, and can be applied to various power conversion apparatuses. In the present preferred embodiment, a two-level power conversion apparatus 200 is used, but a three-level or multilevel power conversion apparatus may be used, and when power is supplied to a single-phase load, the present first and second preferred embodiments may be applied to a single-phase inverter. In addition, when power is supplied to a DC load or the like, the present first and second preferred embodiments can also be applied to a DC/DC converter or an AC/DC converter.

In addition, the power conversion apparatus 200 to which the present first and second preferred embodiments are applied is not limited to the case where the load described above is a motor, and can also be used as a power supply device for, for example, an electrical discharge machine, a laser machine, an induction heating cooker, or a non-contact feeding system, and furthermore, can also be used as a power conditioner of a solar power generation system, a storage system, or the like.

It should be noted that each preferred embodiment can be freely combined, and each preferred embodiment can be appropriately modified or omitted.

While the disclosure has been shown and described in detail, the foregoing description is in all aspects illustrative and not restrictive. It is therefore understood that numerous modifications and variations can be devised.

What is claimed is:

1. A power semiconductor device comprising:
a semiconductor element;
a circuit pattern mounted with the semiconductor element;
an insulating layer mounted with the circuit pattern;
a heat radiation fin mounted with the insulating layer;
a case bonded to a peripheral edge of the heat radiation fin and surrounding the semiconductor element, the circuit pattern, and the insulating layer;
a sealing resin sealed in a region surrounded by the insulating layer, the circuit pattern, and the case;
an internal electrode bonded to the semiconductor element and the circuit pattern, including a flat plate-shaped portion, and including a pair of support portions; and
an external electrode bonded to the internal electrode and integrally molded with the case.

2. The power semiconductor device according to claim 1, wherein the internal electrode is bonded to at least one semiconductor element.

3. The power semiconductor device according to claim 1, wherein each of the support portions is bonded to the circuit pattern not mounted with the semiconductor element.

4. The power semiconductor device according to claim 1, wherein the support portion is comprised of a member identical to a member of the internal electrode and has a pair of tip portions bent.

5. The power semiconductor device according to claim 1, wherein
the support portion is formed of metal, and
one end portion of the support portion is bonded to the circuit pattern and another end portion of the support portion is bonded to the internal electrode so that the semiconductor element and the flat plate-shaped portion of the internal electrode are arranged in parallel.

6. The power semiconductor device according to claim 1, wherein
the flat plate-shaped portion of the internal electrode is provided with a through hole and an embossed portion around the through hole, and
the through hole, the embossed portion, and the semiconductor element are bonded.

7. The power semiconductor device according to claim 6, wherein bonding of the through hole, the embossed portion, and the semiconductor element is also bonded to a surface opposite to the semiconductor element of the embossed portion and is covered in a protruding shape.

8. The power semiconductor device according to claim 6, wherein any one of bonding between the semiconductor element and the circuit pattern, bonding between the support portion and the circuit pattern, bonding between the through hole, the embossed portion, and the semiconductor element, and bonding between the internal electrode and the external electrode is performed with any one of solder containing Sn and a sintered material formed of metal fine particles.

9. A power conversion apparatus comprising:
a main conversion circuit including the power semiconductor device according to claim 1, the main conversion circuit being configured to convert power to be input to output the converted power;
a drive circuit configured to output to the power semiconductor device a drive signal for driving the power semiconductor device; and
a control circuit configured to output to the drive circuit a control signal for controlling the drive circuit.

10. A method for manufacturing a power semiconductor device, the method comprising the steps of:
bonding a semiconductor element to a circuit pattern mounted on a heat radiation fin with interposition of an insulating layer;
bonding the semiconductor element to an internal electrode, and bonding a support portion of the internal electrode to the circuit pattern;

bonding the heat radiation fin to a case;
bonding the internal electrode to an external electrode integrally molded with the case;
wire-bonding and connecting by wiring the semiconductor element to a control terminal integrally molded with the case with a metal wire; and
sealing with resin a region surrounded by the insulating layer, the circuit pattern, and the case.

11. A method for manufacturing a power semiconductor device, the method comprising the steps of:
bonding a semiconductor element to a circuit pattern mounted on a heat radiation fin with interposition of an insulating layer, and bonding a support member to the circuit pattern;
bonding the semiconductor element to an internal electrode, and bonding the support member to the internal electrode;
bonding the heat radiation fin to a case;
bonding the internal electrode to an external electrode integrally molded with the case;
wire-bonding and connecting by wiring the semiconductor element to a control terminal integrally molded with the case with a metal wire; and
sealing with resin a region surrounded by the insulating layer, the circuit pattern, and the case.

* * * * *